US008778811B2

(12) United States Patent
Kraus et al.

(10) Patent No.: US 8,778,811 B2
(45) Date of Patent: *Jul. 15, 2014

(54) LOW TEMPERATURE MIGRATION ENHANCED SI-GE EPITAXY WITH PLASMA ASSISTED SURFACE ACTIVATION

(75) Inventors: Philip A. Kraus, San Jose, CA (US); Dipankar Pramanik, Saratoga, CA (US); Boris Borisov, Edina, CA (US)

(73) Assignee: Intermolecular, Inc., San Jose, CA (US)

( * ) Notice: Subject to any disclaimer, the term of this patent is extended or adjusted under 35 U.S.C. 154(b) by 399 days.

This patent is subject to a terminal disclaimer.

(21) Appl. No.: 13/212,519

(22) Filed: Aug. 18, 2011

(65) Prior Publication Data

US 2013/0045587 A1     Feb. 21, 2013

(51) Int. Cl.
*H01L 21/31* (2006.01)
*H01L 21/469* (2006.01)

(52) U.S. Cl.
USPC ............................ 438/763; 438/483; 438/758

(58) Field of Classification Search
USPC .......................................... 438/483, 758, 763
See application file for complete search history.

(56) References Cited

U.S. PATENT DOCUMENTS

| | | | |
|---|---|---|---|
| 4,716,048 A * | 12/1987 | Ishihara et al. | 427/568 |
| 4,926,229 A * | 5/1990 | Nakagawa et al. | 136/265 |
| 8,318,590 B2 * | 11/2012 | Kraus et al. | 438/483 |
| 8,524,581 B2 * | 9/2013 | Kraus et al. | 438/503 |
| 2006/0134345 A1 * | 6/2006 | Rueger et al. | 427/569 |
| 2007/0215036 A1 * | 9/2007 | Park et al. | 117/88 |

OTHER PUBLICATIONS

Hofer, U., et al.; Desorption of Hydrogen from Si(100) 2x1 at Low Coverages: The Influence of pi-bonded dimers on the Kinetics; Apr. 15, 1992; IBM Research Division; Physical Review B; vol. 45; No. 16; Rapid Communications, pp. 9485-9488.
Mahajan, A., et al.; Si Atomic Layer Epitaxy Using Remote Plasma Assisted Hydrogen Desorption and Disilane as a Precursor; Sep. 17, 1992; Office of Naval Research, Technical Report No. 3, 3 pages.
Tinkha, B.; X-Ray Investigations of the Initial Growth of Si/Ge/Si Heterostructures Grown by Surfactant Mediated Epitaxy; Dec. 2002; Northwestern University; Dissertation, 156 pages.
Hirose, F., et al.; Surface Hydrogen Desorption as a Rate-Limiting Process in Silane Gas-Source Molecular Beam Epitaxy; Sep. 10, 1990; Tohoku University, Japan; Japanese Journal of Applied Physics, vol. 29, No. 10 pp. L 1881-L 1883.
Brunner, K.; Si/Ge Nanostructures; Dec. 12, 2002; Institute of Physics Publishing; Reports on Progress in Physics, pp. 27-72.
Copel, M., et al.; Surfactants in Epitaxial Growth; Aug. 7, 1989; The American Physical Society; Physical Review Letters, vol. 63, No. 6, pp. 632-635.
Rudkevich, E., et al.; Hydrogen Induced Si Surface Segregation on Ge-Covered Si(001); Oct. 19, 1998; The American Physical Society; Physical Review Letters, vol. 81, No. 16, pp. 3467-3470.

* cited by examiner

*Primary Examiner* — Jarrett Stark

(57) ABSTRACT

Epitaxial films are grown by alternately exposed to precursor dosing regions, inert gas plasma regions, hydrogen-containing plasma regions, chlorine-containing plasma and metrology regions, or regions where an atomic hydrogen source is located. Alternately, laser irradiation techniques may be substituted for the plasma energy in some of the processing regions. The film growth process can be implemented at substrate temperatures between about 25 C and about 600 C, together with optional exposures to laser irradiation to cause the surface of the film to melt or to experience a near-melt condition.

19 Claims, 1 Drawing Sheet

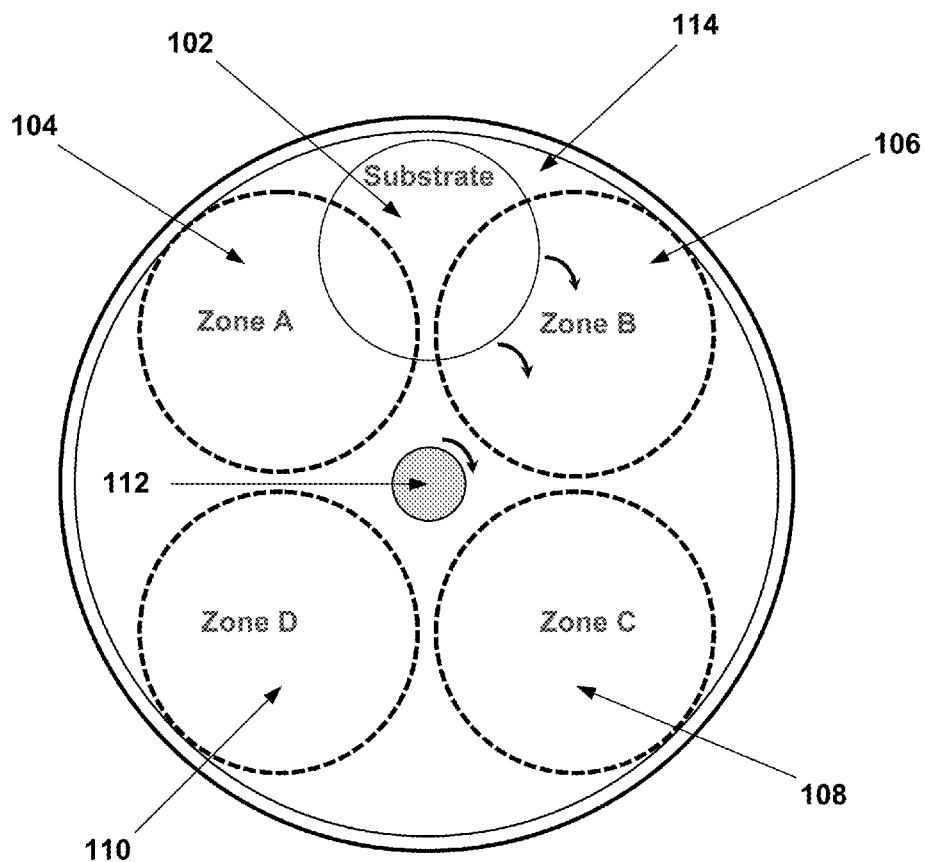

LOW TEMPERATURE MIGRATION ENHANCED SI-GE EPITAXY WITH PLASMA ASSISTED SURFACE ACTIVATION

FIELD OF THE INVENTION

The present invention relates generally to methods and apparatus for forming epitaxial Si, Ge, or Si—Ge alloy films at low temperatures.

BACKGROUND OF THE INVENTION

Semiconductor devices with high carrier mobility are required for high speed communications in frequency ranges from about 1 giga-hertz (GHz) to about 100 GHz. Expensive compound semiconductor materials systems such as InP, GaAs, and GaN are often used for such devices. Typically, these material systems are not compatible with high volume, Si-based CMOS manufacturing processes and cannot benefit from the economies of scale that have been achieved therein. Therefore, the manufacturing cost and systems cost for communication networks using such devices remains high and limits the adoption and deployment of such networks.

Semiconductor devices with semiconductor layers based on strained silicon and/or Si—Ge alloys exhibit properties that are suitable for use in communication networks at frequencies between about 1 GHz to about 75 GHz. Furthermore, these materials are generally compatible with high volume, Si-based CMOS manufacturing processes. Therefore, these material systems are attractive alternatives to the compound semiconductor materials systems listed above.

The strained silicon and/or Si—Ge alloy materials must meet a number of requirements. Ideally, the materials should be deposited epitaxially (i.e. as a single crystal) with a low density of defects such as grain boundaries, dislocations, point defects, etc. Defects serve as scattering sites and lower the mobility of the carriers within the material. High device speeds can be obtained by increasing the concentration of Ge in a Si—Ge alloy. However, at high Ge concentrations and higher temperatures typically used for the thermally activated growth of Si—Ge alloys, the films relax at a critical thickness resulting in a highly defective film. Additionally, Ge tends to segregate or cluster within the film, forming a non-uniform and highly defective film. Other disadvantages of high temperature growth include dopant redistribution, dopant surface segregation, autodoping, and incompatibility with low temperature substrates such as thin film solar cells, thin film transistors, polymers, etc. These disadvantages reduce the mobility of the carriers within the device channel and lower the device speed. Simply lowering the growth temperature to about 550 C results in issues such as a slow deposition rate, and high defect density.

Attempts have been made to address the issues discussed above by depositing epitaxial Si, Ge, and/or Si—Ge alloys using plasma enhanced chemical vapor deposition (PECVD) techniques. Typically, PECVD techniques can be applied at lower temperatures and use plasma energy to drive the chemical reactions. Typically, the various precursor and reactant species are exposed to the plasma region of the reactor. This is generally true for both direct plasma and remote plasma configurations. The plasma energy interacts with the various gaseous species to form ions, electrons, radicals, and energetic neutral species. These various species can interact in the gas phase through unwanted reactions and can form particulate matter that is deposited on the substrate rather than forming the desired film through well controlled surface reactions. Therefore, PECVD has many challenges when applied to the epitaxial growth of Si, Ge, and/or Si—Ge alloys.

Therefore, there is a need to develop methods and apparatus that allow the low temperature growth of Si, Ge, and/or Si—Ge alloys with high Ge concentrations and low defect densities.

SUMMARY OF THE DISCLOSURE

In some embodiments of the present invention, methods are provided wherein substrates are alternately exposed to precursor dosing regions, inert gas plasma regions, hydrogen-containing plasma regions, chlorine-containing plasma and metrology regions, or regions where an atomic hydrogen source is located. Alternately, laser irradiation techniques may be substituted for the plasma energy in some of the processing regions. The various processing regions are isolated and no significant interactions between regions are observed and unwanted gas phase reactions are minimized. The methods may be implemented at substrate temperatures between about 25 C and about 600 C, preferably between about 400 C and about 550 C. The deposition rate of the film, surface diffusion of species on the surface, and surface reaction of species on the growth surface can be influenced by controlling combinations of the gas composition, gas flow rate, pressure and the exposure time of the substrate to each of the regions listed above.

In some embodiments of the present invention, apparatus are described that provide multiple independent regions for processing a substrate. The substrate may be exposed to multiple regions in a sequential manner to influence the growth of a film on the substrate. Each region may comprise a plasma system to supply plasma energy, or laser irradiation to excite the gases within the region, or to excite species adsorbed on the surface, or to cause the surface of the film to melt or to experience a near-melt condition.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 1 illustrates a schematic diagram illustrating four processing regions and a substrate according to some embodiments.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The epitaxial growth of Si from silane has been well characterized. At low temperatures, the deposition proceeds through a number of surface reactions as illustrated in equations 1-5 below where the symbol "_" denotes a surface site. These equations were taken from "*Thin Film Processes II*", edited by John L. Vossen and Werner Kern, published by Academic Press, copyright 1991, page 291 which is herein incorporated by reference.

$$2SiH_4(g) + 4\_ \rightarrow 2\underline{H} + 2\underline{Si}H_3 \qquad \text{Eqn. 1}$$

$$2\underline{Si}H_3 + 2\_ \rightarrow 2\underline{H} + 2\underline{Si}H_2 \qquad \text{Eqn. 2}$$

$$2\underline{Si}H_2 \rightarrow H_2(g) + 2\underline{Si}H \qquad \text{Eqn. 3}$$

$$2\underline{Si}H \rightarrow H_2(g) + 2\_ + \text{FILM} \qquad \text{Eqn. 4}$$

$$4\underline{H} \rightarrow 2H_2(g) + 4\_ \qquad \text{Eqn. 5}$$

The decomposition of $\underline{Si}H$ and the removal of $H_2$ from the surface is the rate determining step at temperatures below about 700 C and especially at temperatures in the range of less than about 550 C (Eqn. 4). At higher temperatures, the adsorption of the $SiH_4$ species becomes the rate determining step (Eqn. 1). The decomposition of $GeH_4$ follows a similar mechanistic pathway. Therefore, any method that can influence the rate of $\underline{Si}H$ decomposition and $H_2$ desorption at temperatures below about 700 C will be beneficial.

In addition to influencing the deposition kinetics as discussed above, the presence of hydrogen on the surface also influences the incorporation of Si and Ge in the film during the deposition. In the absence of hydrogen, the presence of Ge on the surface is energetically favorable over the presence of Si on the surface by an amount equal to about 0.21 eV (see Rudkevich et al., Physical Review Letters, v81, n16, pgs 3467-3470, 1998 which is incorporated herein by reference). In the presence of hydrogen, the presence of Si on the surface is energetically favorable over the presence of Ge on the surface by an amount equal to about 0.03 eV. Therefore, by controlling the presence or absence of hydrogen at the surface, the incorporation and diffusion of Ge across the surface can be influenced.

To influence the rate of Eqn. 4 above at low temperatures, an energy source must be supplied to aid in the decomposition of the $\underline{Si}H$ species and the desorption of the $H_2$. The desorption of $H_2$ from Si has an activation energy of about 2.5 eV (see Hofer et al., Physical Review B, v45, n16, pgs 9485-9488, 1992 which is incorporated herein by reference). In some embodiments of the present invention, the energy source of such desorption is supplied by the use of a plasma which is used to excite an inert gas. Examples of suitable inert gases comprise one or more of He, Ne, Ar, Kr, Xe, or combinations thereof. The plasma will generate excited neutral species with internal energies above about 4 eV. This energy may be used to facilitate the decomposition of the $\underline{Si}H$ species and the desorption of the $H_2$. The use of excited neutral species can reduce or eliminate any potential reaction or ionization effects, for example, by associating with non-inert gas or with charged species. As used herein, a "plasma" is understood to be any one of a direct plasma or a remote plasma. Furthermore, the plasma may be generated using a capacitive coupling configuration or an inductive coupling configuration. In some embodiments of the present invention, laser irradiation is used to excite an inert gas. Examples of suitable inert gases comprise one or more of He, Ne, Ar, Kr, Xe, or combinations thereof. The laser irradiation will generate excited neutral species with internal energies above about 4 eV. This energy may be used to facilitate the decomposition of the $\underline{Si}H$ species and the desorption of the $H_2$.

FIG. 1 illustrates a schematic diagram illustrating a processing apparatus, 100, comprising four processing regions and illustrating a substrate according to some embodiments. A similar apparatus has been described in U.S. application Ser. No. 13/025,046 filed on Feb. 10, 2011, entitled "METHODS AND SYSTEMS FOR FORMING THIN FILMS" and having internal docket number (IM0374_US) and is incorporated herein by reference. A deposition chamber (not shown) comprises a reaction zone wherein there are four independent processing regions. The independent processing regions are fluidically isolated from one another. Although four independent processing regions are illustrated, those skilled in the art will appreciate that any number of independent processing regions can be envisioned, limited only by the number of desired processing steps in the sequence and practical physical limitations. For example, Zone-D can be omitted, and the process sequence comprises Zone-A, Zone-B and Zone-C. Alternatively, both Zone-C and Zone-D are omitted, and the process sequence comprises Zone-A and Zone-B. Further, the processing order, e.g., Zone-A to Zone-B to Zone-C to Zone-D, are shown for illustrative purposes, and those skilled in the art will appreciate that the zones can be arranged in any order. For example, Zone-C can be positioned before Zone-B to form a process sequence comprises Zone-A, Zone-C, Zone-B, and Zone-D. Although a circular configuration is illustrated, those skilled in the art will appreciate that any suitable and practical configuration may be used. Examples might include linear configurations, parallel configurations, oval configurations, square or rectangular configurations, etc.

In FIG. 1, substrate, 102, is held on a substrate holder, 114. Although one substrate is illustrated in FIG. 1, those skilled in the art will appreciate that substrate holder, 114, will generally accommodate multiple substrates resulting in improved processing efficiency. The use of processing apparatus, 100, will be described by using the deposition of a Si—Ge alloy at temperatures below about 600 C as an example. Those skilled in the art will appreciate that the features of processing apparatus, 100, can be applied to many different types of processing sequences, including, but not limited to, the epitaxial growth of Si and/or the epitaxial growth of Ge. Those skilled in the art will also appreciate that the features of processing apparatus, 100, can be applied to the deposition of both the amorphous and polycrystalline versions of films such as Si, Ge, and Si—Ge alloys, all at low temperatures.

In Zone-A, 104, the substrate is exposed to the deposition precursor gases. For this example, the gases might include precursors such as $SiH_4$, $GeH_4$, $Si_2H_6$, $Ge_2H_6$, other suitable Si and Ge containing precursors, or combinations thereof. Zone-A generally does not include the use of plasma energy. The absence of plasma energy in Zone-A reduces the frequency of undesirable gas phase reactions that lead to the formation of particulate matter that is deposited on the substrate rather than forming the desired film through well controlled surface reactions. The precursor gases will adsorb onto the surface, diffuse across the surface, and interact with reactive surface sites as indicated in Eqns. 1-3 listed above. In the example illustrated in FIG. 1, processing apparatus, 100, has a generally circular shape and substrate holder, 114, and substrate, 102, can be rotated about a central axis, 112, to repeatedly expose the substrate to the sequence of processing regions. The exposure dosage of the gases or reactive species to the substrate in the various processing zones can be influenced through combinations of the gas concentration, gas flow rate, pressure, and rotation speed. In this manner, effective growth rates from less than 1 monolayer per cycle to several monolayers per cycle can be achieved.

In Zone-B, 106, the substrate is exposed to an inert gas excited by a plasma source. Alternately, laser irradiation may be used to excite the inert gas. Examples of suitable inert gases comprise one or more of He, Ne, Ar, Kr, Xe, or combinations thereof. The plasma will generate excited neutral species with internal energies above about 4 eV. This energy may be used to facilitate the decomposition of the SiH species and the desorption of the $H_2$ as required in Eqn. 4 above. The plasma conditions are chosen such that the ion density at the substrate surface is negligible and ion bombardment of the surface is minimized to prevent damage. As the excited inert gas neutral species arrive at the surface, a portion of the excess internal energy is used to facilitate the decomposition of the SiH species and the desorption of the $H_2$.

In Zone-C, 108, the substrate may be exposed to a hydrogen plasma. The hydrogen plasma can be used to control the amount of hydrogen on the surface and therefore influence the incorporation and diffusion of Ge across the surface as discussed previously. The hydrogen plasma exposure in this zone will aid to minimize the tendency for Ge to aggregate at higher Ge concentrations by assisting the incorporation of the Ge into the film growth front. Recall that in the presence of hydrogen, the presence of Si on the surface is energetically favorable over the presence of Ge on the surface.

In Zone-D, 110, in-situ metrology techniques may be employed to monitor and control the growth of the epitaxial Si, epitaxial Ge, and/or the epitaxial Si—Ge alloy as the substrate is repeatedly cycled through the processing regions Zone-A, Zone-B, Zone-C, etc. Examples of suitable metrology techniques comprise ellipsometers for measuring thickness, Fourier Transform Infra-red (FTIR) spectrometers for measuring Si—H and Ge—H surface concentrations, optical methods for measuring surface roughness, pyrometers for measuring substrate temperature, etc. Data collected and analyzed from the metrology systems may be used to control the progress of the film growth.

In alternate embodiments of the present invention, the metrology systems discussed above may be substituted for an additional plasma treatment processing region. In one example, HCl or $Cl_2$ could be introduced into a hydrogen plasma to form an active Cl species that may be used for etching the film. This is especially useful for processes wherein the desire is to grow the Si, Ge, and/or Si—Ge alloy selectively on portions of the semiconductor device. Briefly, semiconductor devices wherein a strained Si or Si—Ge alloy is used as the channel material typically have regions of the device where single crystal Si is exposed. The remainder of the device is typically covered by $SiO_2$, $Si_xN_y$, or some other material. In the selective epitaxial growth process, the goal is to grow the strained Si and/or Si—Ge alloy epitaxially on the exposed single crystal Si while minimizing or eliminating the growth on the surrounding materials. In practice, the growth of the strained Si and/or Si—Ge alloy is much faster on the single crystal Si than on the surrounding materials. One method to enhance the selective epitaxial growth process is to expose the substrate to an etchant such as reactive Cl species. The reactive Cl species will react with the growing film to form volatile $SiCl_4$ and $GeCl_4$ species that etch the film. In practice, the etch rate of the film that is deposited on the surrounding materials is much faster than the etch rate of the film that is growing epitaxially on the exposed single crystal Si. These two mechanisms combine to yield a desired epitaxial film on the exposed single crystal Si and little or no film on the surrounding materials. In some embodiments, HCl, $Cl_2$ or combinations thereof are introduced into a hydrogen plasma in one of the processing regions (i.e. Zone-D) to form an active Cl species that may be used for etching the film during the sequential growth processes. This results in the selective growth of the strained Si, Si—Ge alloy, or Ge on the desired regions of the device. Generally, this etching process is not compatible with traditional lower temperature thermal growth processes because the concentration of the reactive Cl species is very low. In this implementation, the creation of the reactive Cl species is caused by the plasma energy and is therefore decoupled from the substrate temperature. Therefore, the concentration of the reactive Cl species may be independently controlled.

In alternate embodiments of the present invention, in the process regions wherein plasma energy is used to excite the various species, laser irradiation may be substituted for the plasma energy to excite the species. As an example, laser irradiation may be used in Zone-B to excite the inert gas molecules to a high internal energy state. This energy may be used to facilitate the decomposition of the SiH species and the desorption of the $H_2$ as required in Eqn. 4 above. The laser irradiation is chosen such that the ion density at the substrate surface is negligible and ion bombardment of the surface is minimized to prevent damage. As the excited inert gas neutral species arrive at the surface, a portion of the excess internal energy is used to facilitate the decomposition of the SiH species and the desorption of the $H_2$.

In some embodiments of the present invention, the substrate is exposed to surfactant species that influence the surface diffusion of the precursor atoms and hence influence the growth of the film. As an example, for the growth of Si—Ge alloys, the addition of Ga, In, Sn, or Pb is known to increase the diffusion of Si on Si surfaces and promotes island formation of Ge on Si surfaces. Alternatively, the addition of As, Sb, Te, or Bi is known to decrease the diffusion of Si on Si surfaces and inhibits island formation of Ge on Si surfaces. A discussion of this effect may be found in the dissertation submitted to Northwestern University in partial fulfillment of the requirements for the degree of Doctor of Philosophy by Bradley Tinkham in December, 2002. In some embodiments of the present invention, the surfactant species are introduced in the same processing region as the precursor gases (i.e. in Zone-A of the example used above). In some embodiments of the present invention, the surfactant species are introduced in a separate processing region from the precursor gases (i.e. not in Zone-A of the example used above).

In some embodiments of the present invention, apparatus are described for the epitaxial growth of Si—Ge alloys. The apparatus comprise two or more processing regions or zones. The apparatus typically operates at pressures ranging from about 1 mTorr to about 760 Torr (i.e. 1 atmosphere) and preferably between about 100 mTorr and about 500 mTorr. Each processing region is fluidically separated from the others such that gaseous species within one processing region do not substantially interact with gaseous species in other processing zones. The apparatus further comprise a substrate holder that accommodates one or more substrates and conveys the substrate(s) through the various processing regions in a predetermined sequence. The substrate holder may be heated using known heating technologies to maintain the substrate(s) at a predetermined temperature during the growth process. Examples of heating technologies comprise resistive heating, induction heating, lamp heating, etc. Alternatively or additionally, the surface of the substrate or a surface of a deposited film can be heated by exposing a substrate to laser irradiation. The laser irradiation can excite species adsorbed on the surface, or to cause the surface of the film to melt or to experience a near-melt condition. The apparatus typically operates at temperatures between about 25 C and about 600 C and preferably between about 400 C and about 550 C. As discussed above, the apparatus may be configured in many different configurations including linear configurations, parallel configurations, oval configurations, square or rectangular configurations, etc. In some embodiments, the substrate holder is circular and rotates about a central axis to sequentially expose the substrate to different processing regions. The substrate holder may rotate at speeds between about 1 revolution per minute (rpm) to about 1000 rpm and preferably between about 30 rpm and about 300 rpm.

Each of the processing regions is configured to deliver one or more gases or precursors to the processing region. Each of the processing regions may further comprise an energy source to couple to the gases or precursors to form ions, radicals, excited species, etc. or to promote gas phase reactions. Examples of energy sources comprise plasma energy, thermal energy, laser energy, etc. Some of the processing regions may contain in-situ metrology techniques may be employed to monitor and control the growth of the Si, Ge, and/or Si—Ge alloy as the substrate is repeatedly cycled through the other processing regions. Examples of suitable metrology techniques comprise ellipsometers for measuring thickness, FTIR spectrometers for measuring surface species concentrations, optical methods for measuring surface roughness, pyrometers for measuring substrate temperature, etc.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for growing a film comprising:
    a) providing a deposition chamber comprising a plurality of processing regions wherein the processing regions are fluidically isolated from one another;
    b) exposing a substrate to one or more precursor gases in a first processing region;
    c) exposing the substrate to excited inert gas neutral species in a second processing region; and
    repeating steps b) and c) until a desired thickness of the film is reached.

2. The method of claim 1 wherein the growth of the film occurs at between about 25 C and about 600 C.

3. The method of claim 1 wherein the growth of the film occurs at between about 400 C and about 550 C.

4. The method of claim 1 wherein the precursor gases include one or more of Si-containing gases, Ge-containing gases, or combinations thereof.

5. The method of claim 4 wherein the Si-containing gases include one of $SiH_4$, or $Si_2H_6$ or combinations thereof.

6. The method of claim 4 wherein the Ge-containing gases include one of $GeH_4$, or $Ge_2H_6$ or combinations thereof.

7. The method of claim 1 wherein the film is an epitaxial film of one of Si, Ge, or a Si—Ge alloy.

8. The method of claim 1 further comprising exposing the substrate to a surfactant precursor during step b).

9. The method of claim 1 wherein an exposure dosage of the one or more precursor gases in step b) is influenced by the rotation speed of a rotating substrate support.

10. The method of claim 1 wherein the thickness of the film after a single sequence of steps b) and c) is less than one monolayer.

11. The method of claim 1 wherein the thickness of the film after a single sequence of steps b) and c) is greater than or equal to one monolayer.

12. The method of claim 1 wherein the excited inert gas neutral species are generated using plasma energy.

13. The method of claim 1 wherein the excited inert gas neutral species are generated using laser irradiation.

14. The method of claim 1 wherein exposing the substrate further comprises exposing the substrate to laser irradiation wherein a surface of the film is heated by laser irradiation.

15. The method of claim 1 further comprising exposing the substrate to a hydrogen plasma before step c).

16. The method of claim 1 further comprising exposing the substrate to a hydrogen plasma after step c).

17. The method of claim 1 further comprising exposing the substrate to a hydrogen plasma that includes a chlorine source.

18. The method of claim 17 wherein the chlorine source is one of HCl or $Cl_2$ or combinations thereof.

19. A method for growing a film comprising:
    a) providing a deposition chamber comprising a plurality of processing regions wherein the processing regions are fluidically isolated from one another;
    b) exposing a substrate to one or more precursor gases;
    c) exposing the substrate to a hydrogen plasma wherein the exposing the substrate to a hydrogen plasma is isolated from the exposing a substrate to one or more precursor gases; and
    repeating steps b) and c) until a desired thickness of the film is reached.

* * * * *